US009407256B2

(12) United States Patent
Körner et al.

(10) Patent No.: US 9,407,256 B2
(45) Date of Patent: Aug. 2, 2016

(54) REDUCING A DISTURBANCE ON A SIGNAL PATH OF A SEMICONDUCTOR SWITCH

(75) Inventors: Peter Körner, Lund (SE); Kaj Ullén, Bjärred (SE)

(73) Assignees: Sony Corporation, Tokyo (JP); Sony Mobile Communications, Inc., Tokyo (JP)

( * ) Notice: Subject to any disclaimer, the term of this patent is extended or adjusted under 35 U.S.C. 154(b) by 239 days.

(21) Appl. No.: 14/111,774

(22) PCT Filed: May 30, 2011

(86) PCT No.: PCT/EP2011/002675
§ 371 (c)(1),
(2), (4) Date: Nov. 15, 2013

(87) PCT Pub. No.: WO2012/163371
PCT Pub. Date: Dec. 6, 2012

(65) Prior Publication Data
US 2014/0098977 A1    Apr. 10, 2014

(51) Int. Cl.
| H02B 1/00 | (2006.01) |
| H03K 17/56 | (2006.01) |
| H04R 3/00 | (2006.01) |
| H04M 1/60 | (2006.01) |

(52) U.S. Cl.
CPC .............. *H03K 17/56* (2013.01); *H04M 1/6008* (2013.01); *H04R 3/00* (2013.01); *H04M 1/6058* (2013.01); *H04R 2410/00* (2013.01)

(58) Field of Classification Search
None
See application file for complete search history.

(56) References Cited

U.S. PATENT DOCUMENTS

| 2005/0156917 | A1* | 7/2005 | Tobita ................. G09G 3/3241 345/204 |
| 2009/0179768 | A1 | 7/2009 | Sander et al. |
| 2009/0251118 | A1 | 10/2009 | Omi |
| 2009/0296952 | A1 | 12/2009 | Pantfoerder et al. |
| 2010/0177924 | A1 | 7/2010 | Xu |
| 2011/0111720 | A1* | 5/2011 | Man ..................... H01Q 1/243 455/269 |

FOREIGN PATENT DOCUMENTS

| GB | 2377848 A | 1/2003 |
| JP | 2006071992 A | 3/2006 |
| WO | 99/38355 A1 | 7/1999 |

OTHER PUBLICATIONS

English Translation of JP2006071992, published Mar. 16, 2006.*
International Search Report and Written Opinion from corresponding International Application No. PCT/EP2011/002675, mailed on Mar. 2, 2012.

(Continued)

*Primary Examiner* — Davetta W Goins
*Assistant Examiner* — James Mooney
(74) *Attorney, Agent, or Firm* — Renner, Otto, Boisselle & Sklar LLP.

(57) ABSTRACT

A method for reducing a disturbance on a signal path is provided. The disturbance is caused by a capacitance (203, 214) of a semiconductor switch (131-133) of an integrated circuit (130). The semiconductor switch (131-133) switches the signal path. The capacitance (203, 214) acts between the semiconductor switch (131-133) and a power supply terminal of the integrated circuit (130). According to the method, the power supply terminal of the integrated circuit (130) is coupled via an impedance (138, 139) to a power supply (137, 140).

17 Claims, 3 Drawing Sheets

(56) References Cited

OTHER PUBLICATIONS

International Search Report and Written Opinion mailed Dec. 23, 2011 from International Application No. PCT/EP2011/004049 that, together with the instant application, claims priority to PCT/EP2011/002675.

International Preliminary Report on Patentability mailed Dec. 2, 2013 from International Application No. PCT/EP2011/004049 that, together with the instant application, claims priority to PCT/EP2011/002675.

International Preliminary Report on Patentability from corresponding International Application No. PCT/EP2011/002675, mailed on Dec. 2, 2013.

* cited by examiner

REDUCING A DISTURBANCE ON A SIGNAL PATH OF A SEMICONDUCTOR SWITCH

FIELD OF THE INVENTION

The present application relates to a method for reducing a disturbance on a signal path, a corresponding circuitry and a device comprising the circuitry. The invention relates especially to reducing a disturbance on a signal path being switched by a semiconductor switch of an integrated circuit, wherein the disturbance is caused by capacitances of the semiconductor switch. The disturbance may comprise for example a resonance, a demodulation, or a bandwidth limitation.

BACKGROUND OF THE INVENTION

Mobile devices, for example mobile phones or smart phones, are frequently used in connection with portable hands-free sets (PHF). These portable hands-free sets comprise for example a stereo earphone, a microphone and an antenna. The portable hands-free set is usually connected to the mobile device via a phone jack comprising for example four electrical contacts. However, currently there are at least two different audio connector standards used for these phone jacks, the OMPT (Open Mobile Terminal Platform) used in Europe and the CTIA (Cellular Telecommunications Industry Association) used in North America. The two connector types differ at least in an interchanged position of the ground and microphone contacts. Therefore, a circuit design is needed which automatically changes the interface to detect and support both standards. Such a circuit design requires the use of analogue semiconductor switches. These switches conduct high currents for the earphone in a common ground return path with the microphone. For this reason the switches must have a low on-resistance. However, switches having a lower on-resistance usually have a high capacitance which is furthermore non-linear. A non-linear circuit acts like an AM (Amplitude Modulation) demodulator. Further functionalities of the portable hands-free set like a FM (Frequency Modulation) radio antenna support requires high impedance ferrite beads which act like coils at lower frequencies. Together with the capacitance in the analogue semiconductor switches a resonance may be created. This may cause problems during mandatory type approval tests like current clamp tests and radiated immunity. Furthermore, this may cause audible bumblebee interference.

Therefore, there is a need to reduce a disturbance on a signal path of a semiconductor switch, especially a reduction of a resonance and demodulation.

SUMMARY OF THE INVENTION

According to the present invention, this object is achieved by a method for reducing a disturbance on a signal path as defined in claim 1, a circuitry as defined in claim 8, and a device as defined in claim 15. The dependent claims define preferred and advantageous embodiments of the invention.

According to an aspect of the present invention, a method for reducing a disturbance on a signal path is provided. The disturbance is caused by a capacitance of a semiconductor switch of an integrated circuit. The disturbance may comprise for example a resonance or a demodulation due to the capacitance of the switch and external components. The semiconductor switch may comprise an analogue semiconductor switch which is configured to switch an analogue audio signal. The semiconductor switch is switching the signal path and the capacitance of the semiconductor switch is acting between the semiconductor switch and a power supply terminal of the integrated circuit. In other words, the capacitance may act between the signal path and ground and power rails of the integrated circuit. According to the method, the power supply terminal of the integrated circuit is connected to a power supply via an impedance.

An analogue switch having a low on-resistance to handle high currents from for example audio signals of an earphone may have a high and non-linear capacitance to the power supply terminals of the integrated circuit, for example to the ground terminal or to the supply voltage terminal. The capacitance may be in the range of 100-250 pF for the semiconductor switch. In connection with further components of the signal path, for example a bead for separating a FM antenna signal from an audio signal, a LC circuit may be created which may influence the signal of the signal path during normal operation and especially for example during a current clamp test. By coupling the power supply terminal of the integrated circuit via an impedance to the power supply, the impedance is effectively placed in series with the capacitance of the semiconductor switch and will reduce the resonance and thus the disturbance. The impedance may have a typical value of, but not limited to, 100 to 1000 Ohms depending on the supply current needed for operating the integrated circuit. Usually, an integrated circuit comprising one or more semiconductor switches requires only very low power supply currents and thus an impedance of a value of 100 to 1000 Ohms does not essentially effect operation of the integrated circuit. However, a lower resistance than 100 Ohm will still reduce the resonance which may also be dependent of the characteristic of the used bead. Furthermore, the resistance may be much higher than 1000 Ohms if the circuit needs less current to work accurately.

According to an embodiment, the impedance may comprise for example a resistive impedance, for example a resistor, or an inductive impedance, for example an inductor, or both. Depending on the application, a resistive impedance and/or an inductive impedance may be best suited for reducing a resonance.

The power supply terminal of the integrated circuit may comprise a ground terminal, a so-called ground rail, and the impedance may be coupled between the ground terminal and a ground potential of the power supply. Further, the power supply terminal of the integrated circuit may comprise a supply voltage terminal, a so-called power rail, and the impedance may be coupled between the supply voltage terminal and a supply voltage potential of the power supply. Furthermore, the integrated circuit may comprise both, a ground terminal and a supply voltage terminal, and a first impedance may be coupled between the ground terminal and a ground potential of the power supply, and a second impedance may be coupled between the supply voltage terminal and a supply voltage potential of the power supply. The capacitance of the semiconductor switch may be a parasitic part of a semiconductor process and non-linear. This parasitic capacitance may exist between the signal path and the ground rail of the integrated circuit or the parasitic capacitance may exist between the signal path and the power rail of the integrated circuit, or the parasitic capacitance may exist between both, the power and ground rails. Depending on this, an impedance in the ground connection of the integrated circuit or an impedance in the supply voltage connection of the integrated circuit or two impedances, one in the ground connection and the other in the supply voltage connection, may contribute to reduce the disturbance on the signal path due to the parasitic capacitance.

According to another aspect of the present invention, a circuitry comprising an integrated circuit and an impedance is provided. The integrated circuit comprises a semiconductor switch and a power supply terminal. The semiconductor switch is adapted to switch a signal path. The semiconductor switch may be adapted to switch the signal path on or off, or the semiconductor switch may be adapted to switch the signal path selectively from a first terminal to a second terminal or from the first terminal to a third terminal, thus acting as a changeover switch. The impedance is coupled between the power supply terminal of the integrated circuit and a power supply. Thus, the impedance reduces a disturbance on the signal path caused by a capacitance of the semiconductor switch which acts between the semiconductor switch and the power supply terminal. The impedance may comprise for example a resistive impedance or an inductive impedance. The impedance may have a value in a range of 100 to 1000 Ohms. As stated above, the semiconductor switch may comprise an analogue semiconductor switch adapted to switch an analogue signal, for example an analogue audio signal. By coupling the impedance between the power supply terminal and the power supply, an impact of the capacitance of the semiconductor switch on the signal path may be reduced and thus a disturbance, for example a resonance, may be reduced.

According to an embodiment, the power supply terminal of the integrated circuit comprises a ground terminal and the impedance is coupled between the ground terminal and a ground potential of the power supply. Thus, an impact of a capacitance, especially a parasitic capacitance, between the signal path of the semiconductor switch and a ground rail of the integrated circuit may be reduced.

According to another embodiment the power supply terminal of the integrated circuit comprises a supply voltage terminal and the impedance is coupled between the supply voltage terminal and a supply voltage potential of the power supply. Thus, an impact of the capacitance acting between the semiconductor switch and a power rail of the integrated circuit may be efficiently reduced.

Furthermore, according to an embodiment, the integrated circuit comprises a ground terminal and a supply voltage terminal. A first impedance is coupled between the ground terminal and a ground potential of the power supply, and a second impedance is coupled between the supply voltage terminal and a supply voltage potential of the power supply. Thus, when the capacitance, especially a parasitic capacitance, is acting between the signal path of the semiconductor switch and both, the ground and the power rails of the integrated circuit, an impact of the capacitance on a signal of the signal path may be reduced by the first and the second impedance.

According to a further aspect of the present invention a device is provided which comprises an audio terminal for receiving an audio signal, a processing unit for processing the received audio signal, and a circuitry as described above. The semiconductor switch of the integrated circuit of the circuitry is coupled between the audio terminal and the processing unit for selectively passing the audio signal from the audio terminal via the signal path of the semiconductor switch to the processing unit. By use of the above-described circuitry a disturbance on the audio signal may be reduced, as an impact of a parasitic capacitance of the semiconductor switch on the audio signal of the signal path is reduced by coupling the power supply terminal of the integrated circuit via the impedance to the power supply.

According to an embodiment, the audio terminal is further adapted to receive an antenna signal in combination with the audio signal. Therefore, the device comprises a bead coupled between the audio terminal and the semiconductor switch for separating the audio signal from the antenna signal. The bead and the capacitance of the semiconductor switch acting between the semiconductor switch and the power supply terminal of the integrated circuit may create a resonant circuit, a so-called LC circuit. This resonant circuit may have a resonance frequency which may disturb the audio signal during normal operation or may degrade the functionality of the device during a current clamp test.

The device may comprise for example a mobile phone, a personal digital assistant, a mobile music player, or a navigation system. Especially in these devices analogue switches may be advantageously used to connect to different audio connector standards of portable hands-free sets.

Although specific features described in the above summary and the following detailed description are described in connection with specific embodiments, it is to be understood that the features of the embodiments may be combined with each other unless specifically noted otherwise.

BRIEF DESCRIPTION OF THE DRAWINGS

The invention will not be described in more detail with reference to the accompanying drawings.

DETAILED DESCRIPTION OF PREFERRED EMBODIMENTS

In the following, exemplary embodiments of the present invention will be described in more detail. It has to be understood that the following description is given only for the purpose of illustrating the principles of the invention and is not to be taken in a limiting sense. Rather, the scope of the invention is defined only by the appended claims and is not intended to be limited by the exemplary embodiments hereinafter.

It is to be understood that the features of the various exemplary embodiments described herein may be combined with each other unless specifically noted otherwise.

Figure 1:
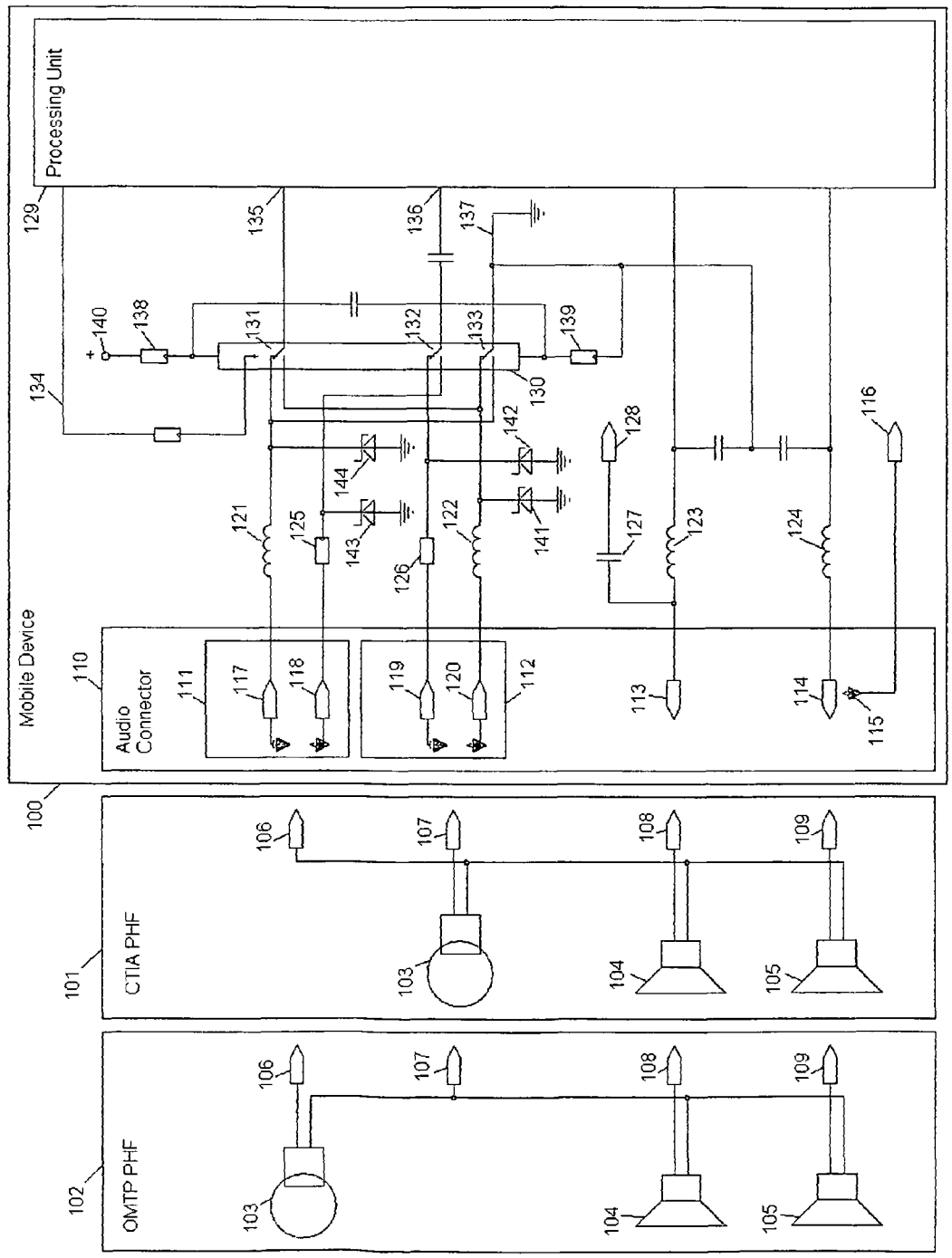
FIG. 1 shows a circuit diagram of a mobile device according to an embodiment of the present invention.

FIG. 1 shows a circuit diagram of a mobile device 100 adapted to automatically detect and adapt to a portable hands-free set (PHF) according to either an OMPT or a CTIA standard. On the left hand side of FIG. 1 the two possible portable hands-free sets 101 and 102 which can be connected to the mobile device 100 via an audio connector 110 are shown. Portable hands-free set (PHF) 101 is wired according to the CTIA standard and portable hands-free set (PHF) 102 is wired according to OMPT standards. Each of the portable hands-free sets 101, 102 comprises a microphone 103, a right ear speaker 104 and a left ear speaker 105. Furthermore, the wire to the right ear speaker 104 may be used as a FM antenna, as will be explained below. The portable hands-free set 101, 102 may be connected to the audio connector 110 of the mobile device 100 via an audio jack. For example, the portable hands-free set 101, 102 may comprise an audio jack plug with four terminals 106-109 which may be received by a corresponding audio jack socket of the audio connector 110 comprising four terminals 111-114 for establishing a connection to the corresponding terminals 106-109 of the portable hands-free set. The audio connector 110 may comprise an additional pin 115 which breaks the connection to terminal 114 when the audio jack plug of the portable hands-free set is inserted into the audio connector 110. Pin 115 may be connected to a corresponding detect line 116 to detect when the portable hands-free set is coupled to the mobile device 100. Terminals 111 and 112 of the audio connector 110 each comprise two terminals 117, 118 and 119, 120, respectively. Terminals 118 and 119 are used as sense terminals to provide best echo cancellation. By using these sense terminals it is possible to sense the lower side of the microphone 103 without any influence from the high currents generated to drive the ear speakers 104, 105. Terminal 118 is used as sense terminal when the CTIA portable hands-free set 101 is connected to the mobile device 100, and terminal 119 is used when the OMTP portable hands-free set 102 is connected to the mobile device 100.

As can be seen from the wiring of the CTIA PHF 101 and OMTP PHF 102, the main difference between the two portable hands-free sets is that the signal from the microphone 103 and the common ground on terminals 106 and 107 are exchanged. In CTIA PHF 101 terminal 106 is the common ground for the microphone 103 and the ear speakers 104, 105, and terminal 107 is used for passing a signal from the microphone 103. In the OMTP PHF 102 the common ground is located at terminal 107 and the signal of the microphone 103 is passed via terminal 106. In both portable hands-free sets 101, 102 a signal for the right ear speaker 104 is passed via terminal 108 and a signal for the left ear speaker 105 is passed via terminal 109. When one of the portable hands-free sets 101, 102 is connected to the mobile device 100, terminal 109 is connected to terminal 114, terminal 108 is connected to terminal 113, terminal 107 is connected to terminal 112 (and thus to terminals 119, 120), and terminal 106 is connected to terminal 111 (and thus to terminals 117 and 118).

As the wiring of the portable hands-free set 101, 102 is used as a FM antenna, each of the terminals of the audio connector 110 is first connected to ferrite beads 121-124 or resistors 125, 126 to provide high impedance for the FM antenna. The FM antenna signal is decoupled from terminal 113 via capacitor 127 and provided for further use at terminal 128. The resistors 125 and 126 furthermore simulate the AC characteristics of the microphone in the audio frequency area to enable echo and bumblebee suppression. Audio signals for the ear speakers 104 and 105 are provided by a processing unit 129 which is connected to the corresponding beads 123 and 124.

To accomplish interworking with the different wiring of the CTIA PHF 101 and OMTP PHF 102 an integrated circuit 130 comprising three analogue semiconductor switches 131-133 is provided. Each of the switches 131-133 comprises an analogue semiconductor changeover switch. The switches 131-133 may be simultaneously toggled from a first switching position to a second switching position and vice versa under control of a control signal on line 134. Therefore, the terminals 111 and 112 are coupled via the beads 121, 122 and the resistors 125, 126 to one side of the switches 131-133, and furthermore, a microphone terminal 135 of the processing unit 129, a sense terminal 136 of the processing unit 129, and ground 137 are connected to another side of the switches 131-133 of the integrated circuit 130. Additionally, for electrostatic discharge (ESD) protection at each coupling between the audio connector 110 and the integrated circuit 130 a corresponding ESD diode 141-144 is connected to ground.

In the first switching position of the switches 131-133 the audio terminal 135 is connected to terminal 117, the sense terminal 136 is connected to terminal 119, and ground 137 is connected to terminal 120. Thus, in the first switching position the OMTP PHF 102 may be correctly driven by the mobile device 100. In the second switching position of the integrated circuit 130 the audio terminal 135 is connected via switch 131 to terminal 120, the sense terminal 136 is connected via the switch 132 to terminal 118, and ground 137 is connected via switch 133 to terminal 117. Thus, in the second switching position the CTIA PHF 101 may be driven by the processing unit 129. To sum up, the three analogue switches 131 and 133 can select between OMPT and CTIA operation by cross-connecting the microphone input signal of the microphone terminal 135 and the common ground 137. The third switch 132 is used for the echo cancellation system. It should be noted that the processing unit 129 may comprise additional standard EMC (Electromagnetic Compatibility) protection components and components of bumblebee and echo cancellation systems. It may also be part of the audio and current clamp input filtering system together with some capacitors and the current clamp rejecting system together with additional (not shown) ferrite beads.

The switches 131-133 must have low on-resistance to handle currents from the ear speakers 104, 105 because the voltage drop over the switches 131-133 will generate a signal that a microphone amplifier senses on its negative rail. Switches 131-133 with low on-resistance usually have a high and non-linear capacitance to the ground and power rails of the integrated circuit 130 in the range of for example 100-250 pF for each switch. This capacitance may be a parasitic part of a semiconductor process of the integrated circuit 130 and may be non-linear. The microphone 103 is therefore loaded with the capacitance of two switches and between the microphone and the switches are the ferrite beads 121 and 122, respectively. For separating the FM signal from the audio signal a high impedance at for example 100 MHz and a low resistance at audio frequencies may be required. This may be accomplished by the FM antenna isolation/tuning beads 121-124 which are only reactive for frequencies lower than 30 MHz and will create a resonant LC circuit at these frequencies with a resonant frequency. However, other components or other beads may be used instead.

Figure 2:
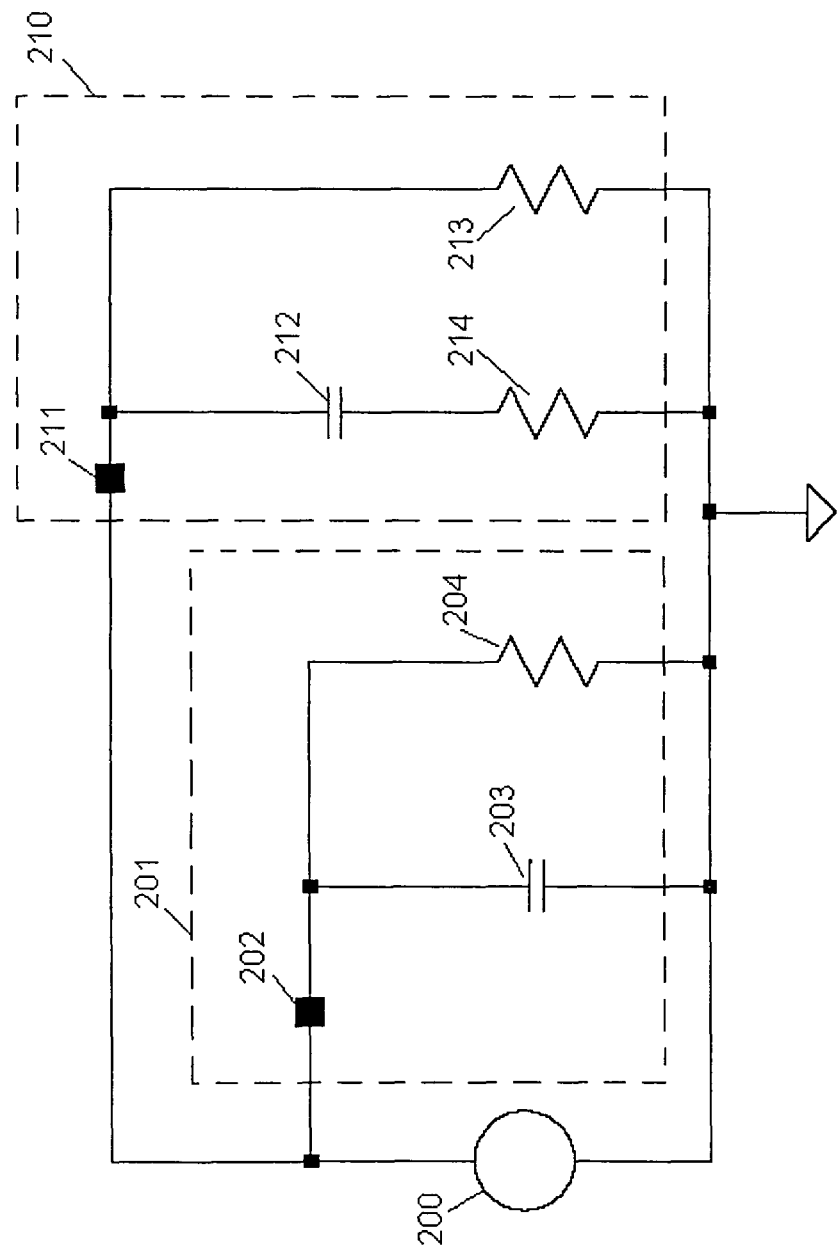
FIG. 2 shows an equivalent circuit diagram for simulating an impact of a capacitance and an impedance of a circuitry according to an embodiment of the present invention.

In FIG. 2 a circuit 201 shows an equivalent circuit diagram for this situation, wherein inductivity 202 corresponds to the bead 121 or 122 and the capacity 203 corresponds to the capacity of switches 131 and 133. The resulting LC circuit is stimulated by an alternating source 200 and drives a load 204 of for example 1.6 k Ohms. The value of the load 204 corresponds to a typical output impedance from a microphone circuit. In an actual circuit it is the current clamp coil that drives the cabling and the output impedance of that circuit may vary depending on the cabling, e.g. it may be much lower than 1.6 k Ohms. A simulation of a signal over the resistor 204 of the circuit 201 with a frequency sweep of the alternating source 200 in a range of 150 kHz to 80 MHz is shown in magnitude 301 and phase 302 in FIG. 3. This simulation corresponds to performing a current clamp test mandatory for mobile devices. During this current clamp test an amplitude modulated carrier is swept between 150 kHz and 80 MHz and induced to the circuit of the mobile device. This carrier will hit the resonance around 10 MHz described by the magnitude curve 301 in FIG. 3 and will therefore be amplified up to 20 dB before it hits the non-linear switch which then demodulates the signal.

Therefore, to avoid this resonance, in the circuit of FIG. 1 the power supply of the integrated circuit 130 is connected via resistors 138 and 139. In detail, a supply voltage terminal of the integrated circuit 130 is connected via impedance 138 to a supply voltage 140 of the mobile device 100, for example a plus pole of a battery of the mobile device 100, and a ground terminal of the integrated circuit 130 is connected via the impedance 139 to ground 137 of the mobile device 100, for example a minus pole of a battery of the mobile device 100. Suitable values for the impedances 138 and 139 are in the range of 100-1000 Ohms, for example 220 Ohms each. The impedances 138 and 139 are possible to introduce in the power supply lines of the integrated circuit 130 because the switches 131-133 require only very low supply current while still handling high current in a signal path of each switch 131-133. As the capacitance in the switches 131-133 is referred to the ground and power rails of the integrated circuit 130, the resistors 138, 139 are effectively placed in series with the capacitance and will reduce the resonance.

Figure 3:
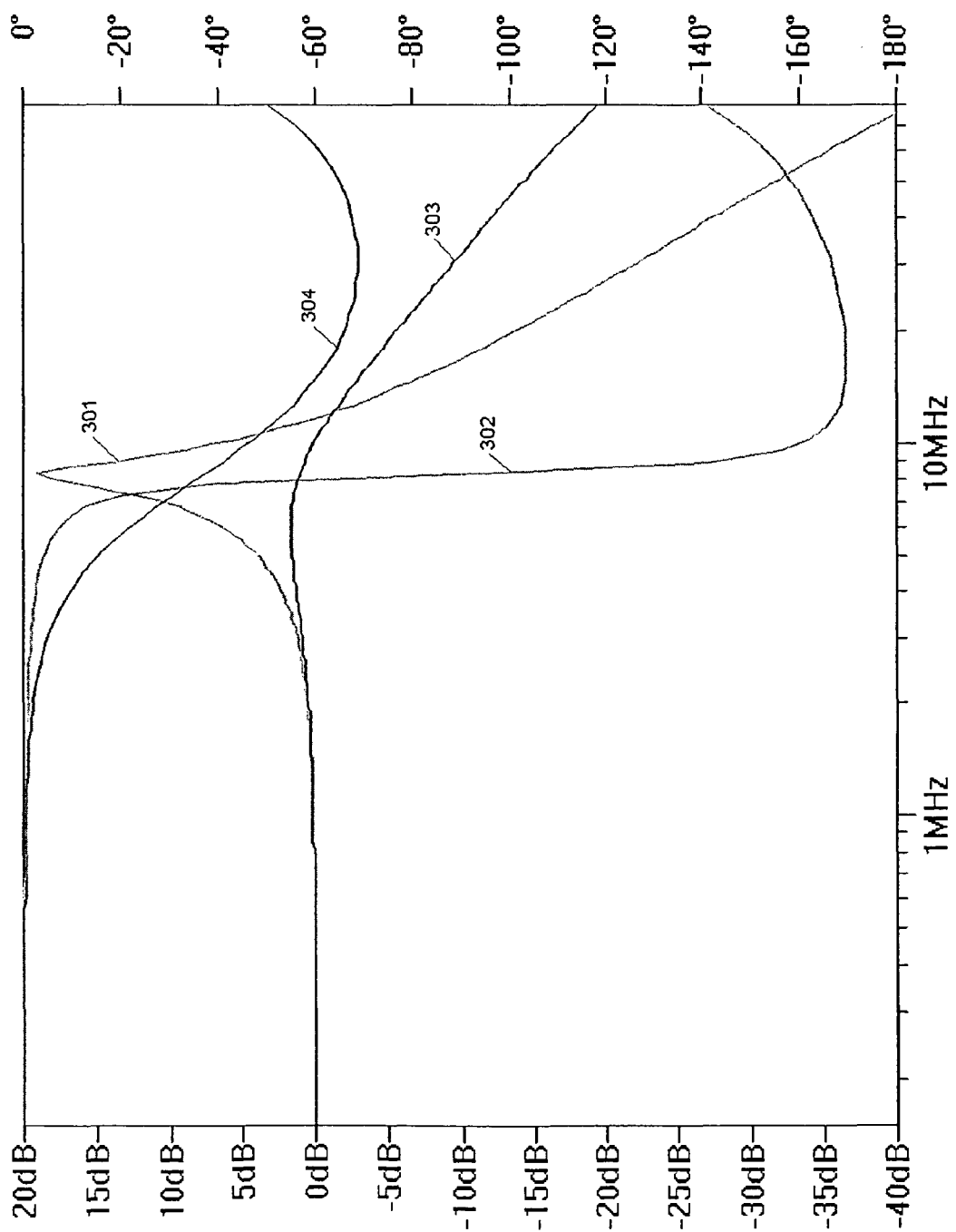
FIG. 3 shows simulation results of a simulation according to the equivalent circuit diagram of FIG. 1.

Circuit 210 of FIG. 2 shows an equivalent circuit diagram of the series connection of the equivalent capacitance 212 of the switch 131-133 and resistor 214 which corresponds to impedance 139 of FIG. 1. As described in connection with circuit 201 above, inductivity 211 corresponds to the bead 121 or 122 of FIG. 1 and the resistor 213 represents the load represented by the processing unit 129. FIG. 3 shows a magnitude 303 and phase 304 at the load 213 in response to a frequency sweep between 150 kHz and 80 MHz. As can be seen from FIG. 3, the resonance around 10 MHz can be avoided effectively by introducing resistor 214. In the example shown in FIG. 2 the resistor 214 has a value of 110 Ohms, the load resistor 213 has 1.6 k Ohms and the capacitance 212 has a value of 250 pF. By avoiding a carrier resonance, the amount of demodulated signal can be decreased considerably.

Another advantage of the resistors 138 and 139 of FIG. 1 is how they effect electrostatic discharge protection (ESD). The ESD diodes 141-144 reject only a first part of an electrostatic discharge. The remaining charge will hit internal ESD diodes in the switches 131-133 of the integrated circuit 130 which conduct the charge to ground or power supply. This may brake the internal ESD diodes and the integrated circuit 130 will be destroyed. By adding the serial resistors 138 and 139 between the internal ESD diodes this effect can be mitigated. Therefore, the resistors 138, 139 introduced in the power and ground rails minimize resonance and demodulation in the circuit of the mobile 100 and also prevents ESD problems.

While exemplary embodiments have been described above, various modifications may be implemented in other embodiments. For example, if the capacitance of the switches 131-133 is mainly acting between the switch 131-133 and the ground rail of the integrated circuit 130, only resistor 139 may be present and the supply voltage terminal of the integrated circuit 130 may be directly coupled to the supply voltage potential 140 of the mobile device 100. Likewise, when the capacitance is mainly acting between the switches 131-133 and a power rail of the integrated circuit 130, only resistor 138 may be used and the ground terminal of the integrated circuit 130 may be directly coupled to ground 137. Furthermore, the resistors 138, 139 may be replaced by inductors or a combination of resistors and inductors if applicable.

Finally, it is to be understood that all the embodiments described above are considered to be comprised by the present invention as at is defined by the appended claims.

The invention claimed is:

1. A method for reducing a disturbance on a signal path, the disturbance being caused by a parasitic capacitance of an analog semiconductor switch of an integrated circuit, the integrated circuit further including i) at least one input terminal, ii) an output terminal, and iii) a power supply terminal for providing power to operate the integrated circuit, the power supply terminal separate from the at least one input terminal and the output terminal, wherein the analog semiconductor switch selectively couples the output terminal to the at least one input terminal, the analog semiconductor switch being provided for switching an analog audio signal of the signal path, the parasitic capacitance acting between the analog semiconductor switch and a power supply terminal of the integrated circuit, the method comprising coupling the power supply terminal of the integrated circuit via an impedance to a power supply.

2. The method according to claim 1, wherein the impedance comprises at least one of the group consisting of a resistive impedance and an inductive impedance.

3. The method according to claim 1, wherein the impedance has a value of 100-1000 Ohms.

4. The method according to claim 1, wherein the power supply terminal of the integrated circuit comprises a ground terminal, wherein the impedance is coupled between the ground terminal and a ground potential of the power supply.

5. The method according to claim 1, wherein the power supply terminal of the integrated circuit comprises a supply voltage terminal, wherein the impedance is coupled between the supply voltage terminal and a supply voltage potential of the power supply.

6. The method according to claim 1, wherein the integrated circuit comprises a ground terminal and a supply voltage terminal, wherein a first impedance is coupled between the ground terminal and a ground potential of the power supply, and a second impedance is coupled between the supply voltage terminal and a supply voltage potential of the power supply.

7. The method according to claim 1, wherein the at least one input terminal comprises at least two input terminals, and the analog semiconductor switch selectively couples the output terminal to one of the at least two input terminals.

8. A circuitry comprising:
an integrated circuit comprising
   i) at least one input terminal,
   ii) an output terminal,
   iii) a power supply terminal for providing power to operate the integrated circuit, and
   iv an analog semiconductor switch adapted to switch an analog audio signal of a signal path,
   wherein the power supply terminal is separate from the at least one input terminal and the output terminal, and the analog semiconductor switch selectively couples the output terminal to the at least one input terminal, and
an impedance coupled between the power supply terminal, and a
power supply for reducing a disturbance on the signal path caused by a parasitic capacitance of the analog semiconductor switch, the parasitic capacitance acting between the analog semiconductor switch and the power supply terminal.

9. The circuitry according to claim 8, wherein the impedance comprises at least one of the group consisting of a resistive impedance and an inductive impedance.

10. The circuitry according to claim 8, wherein the impedance has a value of 100-1000 Ohms.

11. The circuitry according to claim 8, wherein the power supply terminal of the integrated circuit comprises a ground terminal, wherein the impedance is coupled between the ground terminal and a ground potential of the power supply.

12. The circuitry according to claim 8, wherein the power supply terminal of the integrated circuit comprises a supply voltage terminal, wherein the impedance is coupled between the supply voltage terminal and a supply voltage potential of the power supply.

13. The circuitry according to claim 8, wherein the integrated circuit comprises a ground terminal and a supply voltage terminal, wherein a first impedance is coupled between the ground terminal and a ground potential of the power supply, and a second impedance is coupled between the supply voltage terminal and a supply voltage potential of the power supply.

14. A device comprising:
    an audio terminal for receiving an analog audio signal,
    a processing unit for processing the received analog audio signal, and
    a circuitry according to claim 8, wherein the analog semiconductor switch is coupled between the audio terminal and the processing unit for selectively passing the analog audio signal from the audio terminal via the signal path to the processing unit.

15. The device according to claim 14, wherein the audio terminal is further adapted to receive an antenna signal in combination with the analog audio signal, wherein the device comprises:
    a bead coupled between the audio terminal and the analog semiconductor switch for separating the analog audio signal from the antenna signal.

16. The device according to claim 14, wherein the device comprises at least one device of a group consisting of a mobile phone, a personal digital assistant, a mobile music player, and a navigation system.

17. The circuitry according to claim 8, wherein the at least one input terminal comprises at least two input terminals, and the analog semiconductor switch is adapted to selectively couple the output terminal to one of the at least two input terminals.

\* \* \* \* \*